United States Patent
Takasu et al.

(10) Patent No.: US 7,839,087 B2
(45) Date of Patent: Nov. 23, 2010

(54) LIGHT EMITTING DEVICE AND METHOD OF MANUFACTURING THE SAME

(75) Inventors: Isao Takasu, Komae (JP); Yuko Nomura, Kawasaki (JP); Tsuyoshi Hioki, Yokohama (JP); Isao Amemiya, Machida (JP); Kazuhide Abe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 329 days.

(21) Appl. No.: 12/122,472

(22) Filed: May 16, 2008

(65) Prior Publication Data

US 2009/0021140 A1 Jan. 22, 2009

(30) Foreign Application Priority Data

May 18, 2007 (JP) .......................... P2007-132552

(51) Int. Cl.
    H01J 1/62 (2006.01)
(52) U.S. Cl. ........................................ 313/512; 313/498
(58) Field of Classification Search ................. 313/498, 313/502, 512
    See application file for complete search history.

(56) References Cited

U.S. PATENT DOCUMENTS

| 5,959,316 | A | 9/1999 | Lowery |
| 6,576,488 | B2 | 6/2003 | Collins, III et al. |
| 7,091,656 | B2 * | 8/2006 | Murazaki et al. ............ 313/487 |
| 2004/0069993 | A1 | 4/2004 | Murano |
| 2006/0105485 | A1 | 5/2006 | Basin et al. |
| 2009/0020773 | A1 | 1/2009 | Nomura et al. |
| 2009/0021140 | A1 | 1/2009 | Takasu et al. |

FOREIGN PATENT DOCUMENTS

| EP | 1 503 468 A2 | 2/2005 |
| EP | 1 928 029 A1 | 6/2008 |
| JP | 6-238884 | 8/1994 |
| JP | 7-99345 | 4/1995 |
| JP | 8-99408 | 4/1996 |
| JP | 2004-119583 | 4/2004 |
| WO | WO 2005/062391 A1 | 7/2005 |
| WO | WO 2007/034575 A1 | 3/2007 |

OTHER PUBLICATIONS

Extended European Search Report issued by the European Patent Office on Mar. 9, 2010, for European Application No. 08156366.0.
Luo et al., "Analysis of high-power packages for phosphor-based white-light-emitting diodes," Applied Physics Letters (2005), 86:243505-1-243505-3.
First Examination Opinions Notification issued by the Chinese Patent Office on Jun. 5, 2009, for Chinese Patent Application No. 2008100994933, and English-language translation thereof.

* cited by examiner

Primary Examiner—Vip Patel
(74) Attorney, Agent, or Firm—Finnegan, Henderson, Farabow, Garrett & Dunner, L.L.P.

(57) ABSTRACT

A method of manufacturing a light emitting device. The method includes: mounting a light emitting chip on a substrate; forming a transparent resin portion and a phosphor layer by using a liquid droplet discharging apparatus, the transparent resin portion being formed in a shape of a dome and covering the light emitting chip to fill an exterior thereof on the substrate, a phosphor layer containing phosphor and being formed on an exterior of the transparent resin portion close to at least a top side thereof; and forming a reflecting layer at a position exterior of the transparent resin portion and the phosphor layer close to the substrate.

5 Claims, 3 Drawing Sheets

LIGHT EMITTING DEVICE AND METHOD OF MANUFACTURING THE SAME

The entire disclosure of Japanese Patent Application No. 2007-132552 filed on May 18, 2007 including specification, claims, drawings and abstract is incorporated herein by reference in its entirety.

BACKGROUND OF THE INVENTION

1. Field of the Invention

The present invention relates to a light emitting device including a light emitting diode (LED) chip mounted on a substrate, and a phosphor-containing transparent resin arranged in an exterior of the LED chip, and a method of manufacturing the light emitting device.

2. Description of the Related Art

There has been known a white LED light emitting device produced by a combination of an LED chip emitting excited light of a low wavelength and phosphor particles having wavelength conversion performance, in which the LED chip is mounted on a substrate attached with a reflecting plate and a transparent resin layer in which yellow phosphor particles are dispersed is coated on the LED chip (see JP-A-7-99345). However, in such a white LED light emitting device, since phosphor particles are evenly distributed, light emission color becomes more yellowish as an optical path from the LED chip through a phosphor layer becomes longer, which may result in undesired color unevenness.

As disclosed in U.S. Pat. No. 6,576,488, when a light emitting device has a structure including a uniform phosphor layer formed near an LED chip, dependency of amount of phosphor on direction is reduced, thereby decreasing color unevenness. However, in this structure, since the phosphor layer contacts the LED chip, there arises a problem in that the LED chip absorbs light emitted from the phosphor layer and the phosphor layer absorbs heat generated by the LED chip.

To overcome such problems, there has been proposed a structure in which a uniform phosphor layer is formed on a transparent resin layer and an LED chip is isolated from the phosphor layer. See, Hong Luo et al. APPLIED PHYSICS LETTER, 86, 243505 (2005), "Analysis of high-power packages for phosphor-based white-light-emitting diodes". With this structure, the problem caused by contact between the LED chip and the phosphor may be significantly overcome.

In addition, apart from the above-described white LED structure, there has been known a white LED structure including an ultraviolet LED chip and red, green and blue color phosphors excited by light emission from the LED chip (See U.S. Patent Application Publication No. 2006/0105485). In this case, it is possible to obtain white light by forming a mixture layer of red, blue and green color phosphors on a semi-spherical transparent resin layer formed on a substrate on which the ultraviolet LED chip is mounted. However, such mixture of red, blue and green color phosphors is apt to absorb light in a low wavelength band. To overcome this, there has been proposed a method of laminating a phosphor layer emitting light having a lower wavelength to be located in an inner layer.

However, the above-mentioned multi-layered structure including the phosphor layer and the transparent resin layer requires a complicated process, and moreover, it is very difficult to form the multi-layered structure including the phosphor layer and the transparent resin layer on a flat substrate.

SUMMARY OF THE INVENTION

The invention provides a method of manufacturing a light emitting device, including: mounting a light emitting chip on a substrate; forming a transparent resin portion and a phosphor layer by using a liquid droplet discharging apparatus, the transparent resin portion being formed in a shape of a dome and covering the light emitting chip to fill an exterior thereof on the substrate, a phosphor layer containing phosphor and being formed on an exterior of the transparent resin portion close to at least a top side thereof; and forming a reflecting layer at a position exterior of the transparent resin portion and the phosphor layer close to the substrate.

BRIEF DESCRIPTION OF THE DRAWINGS

Embodiment may be described in detail with reference to the accompanying drawings, in which.

DETAILED DESCRIPTION OF THE INVENTION

First Embodiment

Figure 1:
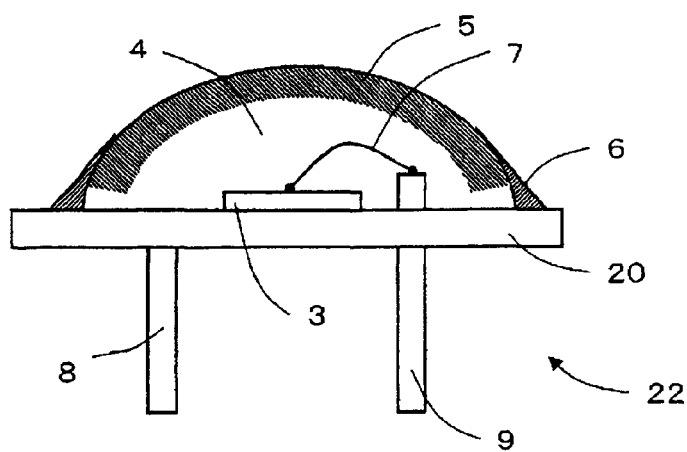
FIG. 1 is an elevation view showing a configuration of a light emitting device according to a first embodiment of the invention.

A white LED light emitting device according to a first embodiment of the invention includes a substrate 20, an LED chip 3 which is an excitation light source of a phosphor and is mounted on the substrate 20, a transparent resin layer (transparent resin portion) 4 formed on the substrate 20 in a shape of dome (for example, semispherical shape) to cover the LED chip 3, and a phosphor layer 5 formed on an outer side of the transparent resin layer 4, as shown in FIG. 1. A ring-shaped region having no phosphor layer 5 is provided in an outer side of a portion near a boundary between the semi-spherical transparent resin layer 4 and the substrate 20. A reflecting layer 6 is formed to cover this region. The LED chip 3 is connected to electrodes 8 and 9 on a lead frame 22 by means of a gold wire boding 7 or the like.

Figure 2:
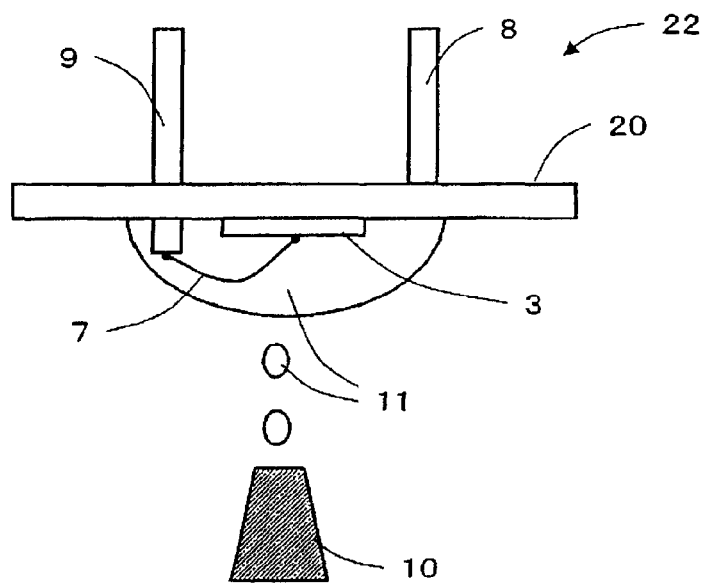
FIG. 2 is an elevation view showing a dome forming step in a method of manufacturing the light emitting device of FIG. 1 according to the embodiment.
Figure 3:
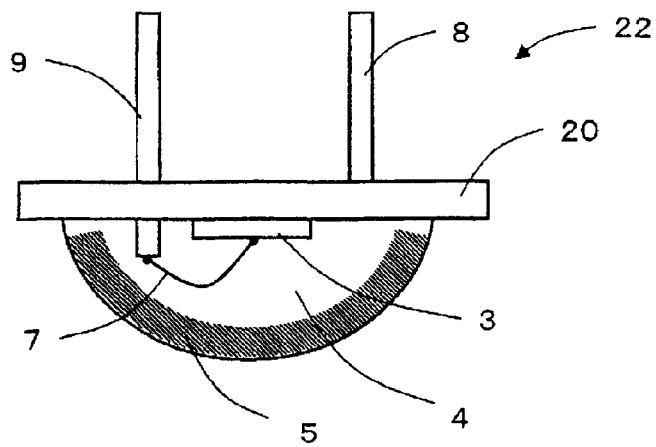
FIG. 3 is an elevation view showing a precipitation step in the method of manufacturing the light emitting device.
Figure 4:
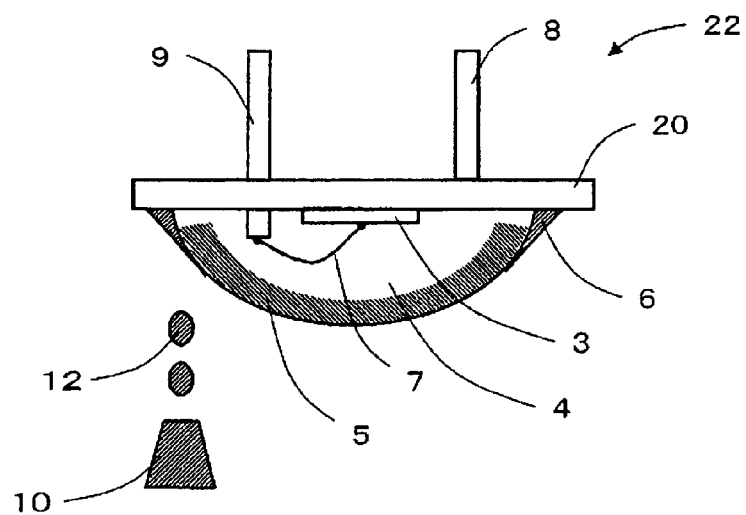
FIG. 4 is an elevation view showing a reflecting layer forming step in the method of manufacturing the light emitting device.

The LED light emitting device as constructed above is manufactured according to an order as shown in FIGS. 2 to 4, for example. First, the LED chip 3 is mounted on the substrate 20. Next, as shown in FIG. 2, under a state where a surface of the substrate 20 on which the LED chip 3 is mounted is directed downward, a phosphor-containing transparent resin 11 is coated in a shape of dome on the substrate 20. At this time, a liquid droplet discharging apparatus 10 discharges resin liquid droplets upward. Next, before the phosphor-containing transparent resin 11 is cured, phosphor particles contained in the resin 11 are precipitated, thereby forming the phosphor layer 5 composed of phosphor particles gathered near a surface of the dome-shaped structure, as shown in FIG. 3, and then, the formed phosphor layer 5 is separated from the inner transparent resin layer 4. Thereafter, the transparent resin 11 is cured.

Next, as shown in FIG. 4, the ring-shaped reflecting layer 6 is formed to surround a portion near a boundary between the transparent resin layer 4 and the substrate 20. At this time, like the coating of the phosphor-containing transparent resin 11, the liquid droplet discharging apparatus 10 discharges metal-containing ink upward, thereby forming the reflecting layer 6.

Although it has been illustrated in this embodiment that the phosphor-containing transparent resin 11 is formed to have the dome-shaped structure and then the phosphor particles contained in the resin to form the phosphor layer 5, alternatively, a small semi-spherical structure by only transparent resin may be first formed on the LED chip 3, and then a phosphor-containing transparent layer may be overlapped with the small semi-spherical structure, thereby completing the phosphor layer 5.

In this manner, it is possible to isolate the phosphor from the LED chip 3 and form the phosphor layer 5 on the outer side of the semi-spherical transparent resin layer 4. The larger the diameter of phosphor particles is, the faster the phosphor particles are precipitated. Accordingly, the formed phosphor layer has a structure in which the particle diameter increases in a radial direction of the semi-spherical structure. In the phosphor particle layer formed by the precipitation, particles having larger diameter are first deposited on the outer side of the semi-spherical structure and then particles having smaller diameter are deposited in such a manner to fill gaps formed by the particles having larger diameter. Accordingly, unevenness of thickness of the phosphor layer becomes decrease.

In this embodiment, the substrate 20 may be a substrate on which the LED chip 3 of the lead frame 22 is mounted. Alternatively, the substrate 20 may be either a ceramic flat substrate or a glass flat substrate.

In consideration of the manufacturing process, particularly a high speed manufacturing process, it is preferable that the phosphor particles are quickly precipitated in the semi-spherical transparent resin. Since the phosphor particles are faster precipitated as the transparent resin layer 4 has lower viscosity. In general, since it is difficult for the liquid droplet discharging apparatus 10 to discharge liquid having high viscosity, and accordingly, in respect of discharge ability, it is preferable that the transparent resin layer has low viscosity.

For example, if the diameter of the phosphor particles is about 30 μm, the content of phosphor in the phosphor-containing transparent resin 11 discharged by the liquid droplet discharging apparatus is preferably 15 wt % to 60 wt %. For the phosphor-containing transparent resin of the same wt % of phosphor and the same blue LED chip, as the size of the formed semi-spherical structure becomes increases, the amount of yellow phosphor tends to be excessive, thereby showing more yellowish emission. If the diameter of the semi-spherical structure is about 1 mm, the concentration of phosphor is preferably 40 to 50 wt %.

In this embodiment, an inkjet apparatus used for a printer and the like may be used as the liquid droplet discharging apparatus 10. In general, a piezoelectric type or thermal type liquid droplet discharging apparatus can stably discharge only ink having low viscosity of less than about 30 mPa·s or ink containing particles having small diameter in consideration of nozzle cogging. On the other hand, a converged ultrasonic type liquid droplet discharging apparatus (see JP-A-6-238884 and JP-A-8-99408) can discharge ink having higher viscosity or liquid droplets containing particles having diameter of several tens microns since it does not require any nozzle which is the cause of ink cogging. Accordingly, by means of the converged ultrasonic type liquid droplet discharging apparatus, it is possible to discharge resin having high viscosity (>100 mPa·s) or resin liquid droplets containing phosphor particles having diameter of 10 μm, which is used for packaging of white LEDs.

In this embodiment, with use of the ultrasonic liquid droplet discharging apparatus for discharge of transparent resin and phosphor particles, the viscosity of the transparent resin is preferably less than 300 mPa·s, more preferably less than 1000 mPa·s in consideration of stable patterning ability. On the other hand, dispersibility of phosphor in an ink chamber of the liquid droplet discharging apparatus is preferably high and viscosity for the phosphor is preferably high since the phosphor is prevented from being precipitated. Accordingly, from this point of view, the viscosity of the transparent resin is preferably more than 100 mP·s.

It is preferable that the transparent resin has low viscosity for discharge of the liquid droplet discharging apparatus and can be cured after being impacted on the substrate 20. Specifically, the transparent resin is preferably thermosetting silicon resin or thermosetting epoxy resin. However, organic polymer materials such as epoxy resin is apt to be deteriorated by an LED chip light source and maybe colored when they are used for a long time. Accordingly, the thermosetting silicon resin is preferably used.

The thermosetting resin may be either a single liquid type or a two-liquid mixed type. In addition, since the thermosetting resin can be accelerated by heating the substrate 20, the precipitation of the phosphor can slow down by the heating of the substrate 20. This makes it possible to adjust a phosphor distribution in the semi-spherical structure.

It is preferable that the phosphor material has larger particle diameter since there is a need to quickly form the phosphor layer by the precipitation. In addition, it is preferable that the particle diameter of the phosphor for the light emitting device is larger since larger particle diameter of the phosphor tends to provide higher light output efficiency for a white LED structure. On the other hand, larger particle diameter leads to lower particle dispersibility in an ink chamber of the liquid droplet discharging apparatus and makes it more difficult for the liquid droplet discharging apparatus to discharge ink. Considering these factors collectively, the particle diameter of the phosphor is preferably 5 μm to 100 μm.

In this embodiment, in the forming method of the phosphor layer using the precipitation of the phosphor, a region in which the phosphor is not nearly distributed is formed near the substrate 20 in the semi-spherical structure. Blue color light emitted from the LED chip is leaked through this region, which results in color unevenness of the white LED light emitting device. In general, a white LED has a structure including a reflecting plate arranged in the vicinity of the LED chip in order to increase efficiency of light output to the upper side of the light emitting device.

In this embodiment, by providing the reflecting layer 6 from the outside of a hemisphere at a portion near the substrate 20 in the semi-spherical structure of the white LED light emitting device, color unevenness can be significantly reduced. In this case, in order to prevent leakage of blue color light, the reflecting layer 6 is needed to contact the semi-spherical structure. Accordingly, for the purpose of providing the reflecting layer 6 at a lateral side of the cubic semi-spherical structure, it is preferable that metal-containing ink is coated on the lateral side by means of the liquid droplet discharging apparatus. Exemplary metal-containing ink may include ink in which nano-sized particles of gold, silver, copper or the like are dispersed. From a standpoint of reflectivity, particle stability, etc., silver particle-containing ink is more preferable for formation of the reflecting layer.

In forming the reflecting layer, after forming the semi-spherical structure, the metal-containing ink is coated on the lateral side of the semi-spherical structure by means of the liquid droplet discharging apparatus 10. Dispersing agent for stably dispersing nano-particles is included in the metal-containing ink, thereby obtaining a reflecting layer having high reflectivity by coating, heating and firing the metal-containing ink including the dispersing agent. In this embodiment, using silver nano-colloid-containing ink of low temperature firing type, it is possible to form a reflecting layer having sufficient reflectivity by firing of 150° C. In the firing, if the reflecting layer has cracks, the cracks can be filled up by coating and firing the metal-containing ink repeatedly.

When the phosphor layer 5 is formed by precipitating the phosphor, it is preferable that the diameter of the semi-spherical structure is small for forming the phosphor layer 5 having uniform film thickness. As the diameter of the semi-spherical structure becomes increase, the phosphor tends to concentrate in a leading edge of the semi-spherical structure. However, if low-viscous transparent resin having high affinity with the substrate 20 is coated on the substrate 20, the resin is apt to be spread, thereby making it very difficult to form a semi-spherical structure having a desired size.

In order to prevent the resin from being spread, in case of thermosetting resin, heating the substrate 20 may be considered. However, if the resin is too fast cured, the phosphor layer 5 is insufficiently formed by precipitation, thereby leading to insufficient characteristics of the structure of the light emitting device of this embodiment. Thus, for the purpose of obtaining a semi-spherical structure having a desired size, one method is to make a resin forming portion of the lead frame 22 small. With this method, the semi-spherical structure has the same diameter as the resin forming portion, thereby preventing the resin from being spread. However, this method can not be applied to forming a white LED light emitting device on a typical flat substrate 20.

Another method is to prevent the transparent resin from being spread after being impacted on the substrate by lowering surface energy of the substrate 20. For example, a surface of the substrate 20 is subjected to a water repellency treatment before the transparent resin is coated on the surface. With this method, the transparent resin impacted on the substrate 20 by means of the liquid droplet discharging apparatus 10 has a large contact angle with the substrate 20, thereby making it possible to form a semi-spherical structure having a diameter depending on the amount of impacted resin. An example of the water repellency treatment may include coating fluorine-based polymer on the substrate 20.

In experiment, a semi-spherical structure having a contact angle of about 60° with silicon resin was obtained for surface-treated products on a gold-plated lead frame. On the other hand, for non-surface-treated products, silicon is irregularly spread over the substrate 20, thereby making it difficult to coat an LED chip on the substrate 20. For example, using a release agent, which contains fluorine polymer, as a surface treating agent, the substrate 20 is subjected to a surface treatment by coating a solution of release agent on the substrate 20 by means of a dip coating method or a spin coating method.

As described above, according to this embodiment, it is possible to realize a light emitting device structure having no contact between a light emitting chip and a phosphor layer and achieve a phosphor layer having uniform thickness, thereby realizing a white LED light emitting device having little color unevenness. In addition, using precipitation of phosphor, a double structure of a transparent resin layer and a phosphor layer can be formed by a single coating process by means of a liquid droplet discharging apparatus, which is simplified as compared to conventional processes.

Second Embodiment

Figure 5:
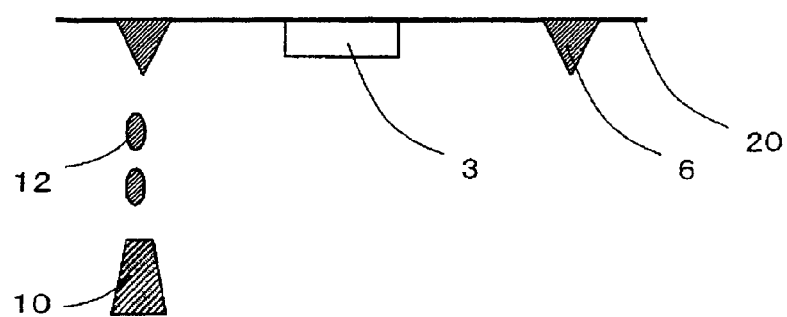
FIG. 5 is an elevation view showing a reflecting layer forming step in the method of manufacturing a light emitting device.
Figure 6:
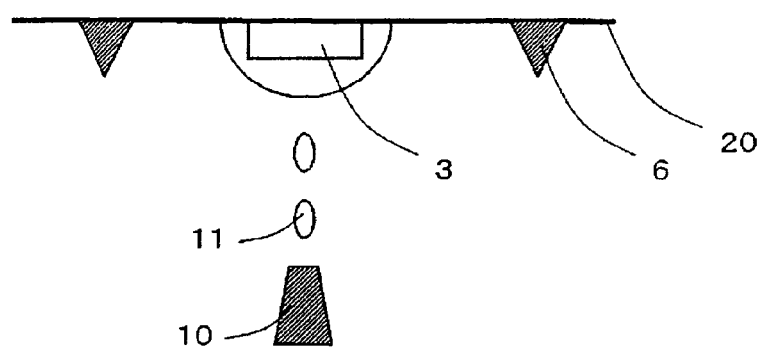
FIG. 6 is an elevation view showing a dome forming step in the method of manufacturing a light emitting device.
Figure 7:
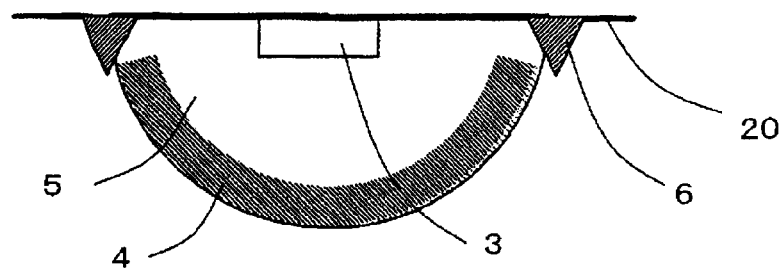
FIG. 7 is an elevation view showing a precipitation step in a method of manufacturing a light emitting device according to a second embodiment of the invention.

As shown in FIGS. 5 to 7, the processes of forming the white LED light emitting device structure as described above may be changed in an order. Specifically, the LED chip 3 is first mounted on the substrate, and then, as shown in FIG. 5, the reflecting layer 6 is formed by coating the metal-containing ink 12 on the flat substrate 20 in a ring shape by means of the liquid droplet discharging apparatus 10. At this tome, by discharging and coating the metal-containing ink having high viscosity on the flat substrate 20 by means of, particularly an ultrasonic type liquid droplet discharging apparatus 10, it becomes easy to a cubic structure of the reflecting layer 6 having a thickness in a direction perpendicular to the substrate 20.

Subsequently, as shown in FIG. 6, a dome is formed by discharging the phosphor-containing transparent resin 11 on the LED chip formed on the substrate 20. Thereafter, the transparent resin is cured after the phosphor is precipitated. Thus, the white LED light emitting device structure as shown in FIG. 7 can be obtained. With the processes of the second embodiment, since a direction of a reflecting surface contacting the transparent resin layer 4 of the reflecting layer 6 becomes a direction in which light emitted from the LED chip 3 is more reflected toward the phosphor layer 5 that the case of the first embodiment, it is possible to achieve a structure advantageous over the first embodiment in respect of light output efficiency.

Third Embodiment

Figure 8:
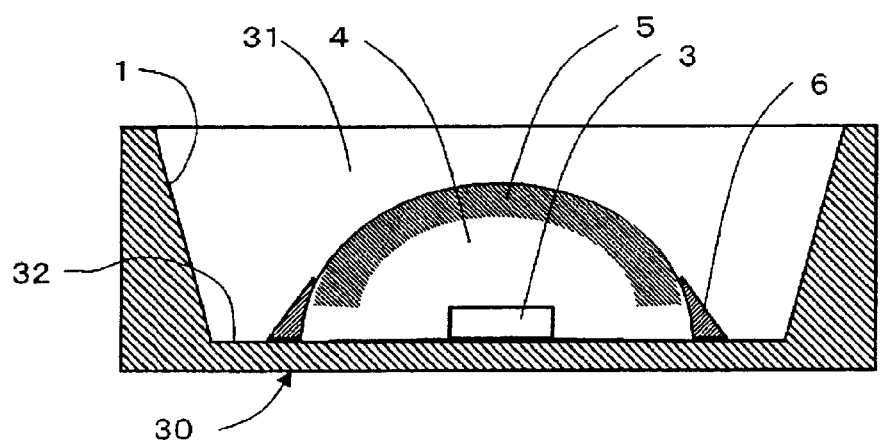
FIG. 8 is an elevation view showing a configuration of a light emitting device according to a third embodiment of the invention.

The manufacturing method of the present invention may be applied to manufacturing a light emitting device using a package cup having a reflecting plate, as shown in FIG. 8. In this embodiment, a package cup 30 having a depressed portion 31 is used instead of a flat substrate, and the LED chip 3 is mounted on the center of the bottom 32 of the depressed portion 31. Next, the semi-spherical transparent resin layer 4 and phosphor layer 5 are formed in the outer side of the LED chip 3, and the ring-shaped reflecting layer 6 is formed near a boundary between the transparent resin layer 4 and the bottom 32 of the depressed portion 31.

In this embodiment, like the first or second embodiment, the transparent resin layer 4, the phosphor layer 5 and the reflecting layer 6 are formed by discharging liquid droplets upward by means of the liquid droplet discharging apparatus 10 under a state where the depressed portion 31 of the package cup 30 on which the LED chip 3 is mounted is directed downward.

At this time, in order to lower surface energy of the bottom 32 of the depressed portion 31, a surface of the bottom 32 may be subjected to a water repellency treatment. As phosphor particles are precipitated in the semi-spherical transparent resin layer, the semi-spherical transparent resin layer 4 and phosphor layer 5 are formed. The process of forming the reflecting layer by coating the metal-containing ink on a lateral side of the transparent resin layer by means of the liquid drop let discharging apparatus 10 is the same as that in the first or second embodiment.

In the third embodiment, a reflecting plate 1 is formed by the lateral side of the depressed portion 31 of the package cup 30. With this configuration, the concentration of light on an upper side of the light emitting device can be enhanced.

Fourth Embodiment

Figure 9:
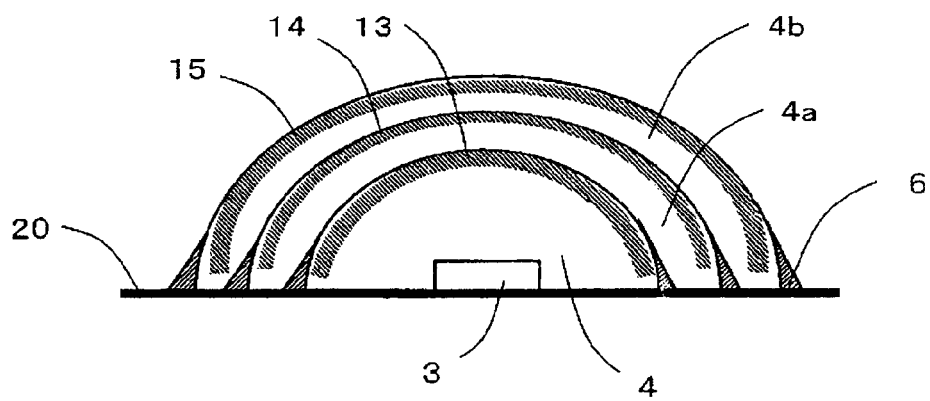
FIG. 9 is an elevation view showing a configuration of a light emitting device according to a fourth embodiment of the invention.

A light emitting device according to a fourth embodiment of the present invention includes an ultraviolet LED chip 3 mounted on the substrate 20, a dome-shaped (for example, semi-spherical) transparent resin layer 4 arranged to cover the ultraviolet LED chip 3, and a red color phosphor layer 13 arranged to cover the transparent resin layer 4, as shown in FIG. 9. Additionally, the light emitting device of the fourth embodiment includes a second transparent resin layer 4a, a green color phosphor layer 14, a third transparent resin layer 4b and a blue color phosphor layer 15, which are formed in order on the red color phosphor layer 13.

The fourth embodiment is an application of the principle of the invention to the white LED structure disclosed in U.S. Patent Application Publication No. 2006/0105485. Specifically, white light is obtained by passing an ultraviolet ray, which is emitted from the ultraviolet LED chip 3, through the red color phosphor layer 13, the green color phosphor layer 14 and the blue color phosphor 15 in turn. In this case, if red, blue and green color phosphors are mixed into a semi-spherical shape, light in a low wavelength band is typically apt to be absorbed. Accordingly, in this embodiment, a phosphor layer emitting light having a lower wavelength is laminated to be located at an outer layer.

Next, a method of manufacturing the light emitting device of the fourth embodiment will be described. First, the ultraviolet LED chip 3 is mounted on the substrate 20, and then, under a state where the substrate 20 on which the ultraviolet LED chip 3 is mounted is directed upward, transparent resin liquid droplets containing red color phosphor particles are upward discharged toward the ultraviolet LED chip 3 by means of the liquid droplet discharging apparatus 10, thereby forming a semi-spherical structure on the substrate 20. Next, after the red color phosphor layer 13 is precipitated near a surface of the semi-spherical structure, transparent resin is heated and cured, thereby forming the transparent resin layer 4 and the red color phosphor layer 13. Thereafter, likewise, green color phosphor-containing resin is coated and cured to form the second transparent resin layer 4a and the green color phosphor layer 14 in order on the red color phosphor layer 13.

Thereafter, additionally, the third transparent resin layer 4b and the blue color phosphor layer 15 are formed on the green color phosphor layer 14.

According to the above processes, a 6-layered structure including the transparent resin layer 4, the red color phosphor layer 13, the second transparent resin layer 4a, the green color phosphor layer 14, the third transparent resin layer 4b, and the blue color phosphor layer 15 are obtained. With this structure, it is possible to realize a white LED with restricted light absorption between colors of phosphor.

What is claimed is:

1. A light emitting device comprising:
   a substrate;
   a light emitting chip mounted on the substrate;
   a transparent resin portion being formed in a shape of dome and covering the light emitting chip mounted on the substrate;
   a phosphor-containing phosphor layer formed at least on an exterior of the transparent resin portion close to a top side thereof; and
   a reflecting layer formed at a position exterior of the dome-shaped transparent resin portion and the phosphor layer close to the substrate.

2. The device according to claim 1,
   wherein the substrate has a flat surface being in contact at least with the light emitting chip, the transparent resin portion and the reflecting layer.

3. The device according to claim 1,
   wherein the phosphor layer includes a plurality of phosphor particles dispersed in the transparent resin; and
   the phosphor particles are distributed to be larger in diameter as positions thereof get closer to a surface of the phosphor layer.

4. The device according to claim 1,
   wherein the light emitting chip comprises a blue color LED chip;
   the phosphor comprises a yellow color phosphor; and
   the light emitting device emits white light.

5. The device according to claim 1, further comprising:
   a second transparent resin portion covering an exterior of the phosphor layer;
   a second phosphor layer containing a green color phosphor and being formed on an exterior of the second transparent resin portion close to at least a top side thereof;
   a third transparent resin portion covering an exterior of the second phosphor layer;
   a third phosphor layer containing a blue color phosphor and being formed on an exterior of the third transparent resin portion close to at least a top side thereof;
   wherein the light emitting chip comprises an ultraviolet LED chip;
   the phosphor comprises a red color phosphor; and
   the light emitting device emits white light.

* * * * *